United States Patent [19]
Mullarkey et al.

[11] Patent Number: 5,264,725
[45] Date of Patent: Nov. 23, 1993

[54] LOW-CURRENT POLYSILICON FUSE

[75] Inventors: Patrick J. Mullarkey; Kurt D. Beigel, both of Boise, Id.

[73] Assignee: Micron Semiconductor, Inc., Boise, Id.

[21] Appl. No.: 986,271

[22] Filed: Dec. 7, 1992

[51] Int. Cl.$^5$ .................... H01L 29/40; H01L 23/48; H01L 27/02; H01L 29/54
[52] U.S. Cl. .................. 257/665; 257/529; 257/530; 257/755
[58] Field of Search ............... 257/530, 529, 665, 486, 257/755; 437/2, 8, 7

[56] References Cited

U.S. PATENT DOCUMENTS

| | | | |
|---|---|---|---|
| 4,210,875 | 7/1980 | Beasom | 330/251 |
| 4,413,272 | 11/1983 | Mochizuki et al. | 357/65 |
| 4,518,981 | 5/1985 | Schlupp | 357/71 |
| 4,598,462 | 7/1986 | Chandreskhar | 29/577 |
| 4,647,340 | 3/1987 | Szluk et al. | 156/662 |
| 4,796,075 | 1/1989 | Whitten | 357/51 |
| 4,823,181 | 4/1989 | Mohsen et al. | 357/51 |
| 4,935,801 | 6/1990 | McClure et al. | 357/51 |
| 5,018,532 | 5/1991 | Kaya | 437/186 |
| 5,059,555 | 10/1991 | Iranmanesh et al. | 437/192 |

Primary Examiner—Andrew J. James
Assistant Examiner—T. M. Arroyo
Attorney, Agent, or Firm—Hopkins, French, Crockett, Springer & Hoopes

[57] ABSTRACT

A submicron-width fuse element is disclosed that protects peripheral DRAM chip devices from low current failures below the range of metal fuse elements. In a specific application, the fuse elements are used to protect a DRAM chip from dielectric failure of voltage supply filtering capacitors. A low cross-section and length allows minimum space for the element.

4 Claims, 5 Drawing Sheets

LOW-CURRENT POLYSILICON FUSE

FIELD OF THE INVENTION

This invention relates to a low-current polysilicon fuse which can be used to isolate sensitive computer chip devices, such as large capacitors, where a metal fuse of the same size would not interrupt the circuit because of the low, yet potentially destructive, currents.

BACKGROUND OF THE INVENTION

In a dynamic random access memory DRAM chip, the peripheral devices used to filter out power-supply noise are banks (hundreds) of capacitors connected across the power supply terminals. In case of capacitor dielectric failure, an excessive current flows (20–40 ma) in the capacitor which can create a high chip standby current or, in a worst case, cause latch-up. Latch-up has the effect of shorting the voltage terminals resulting in chip self-destruction or system failure with the requirement to power down.

It is, therefore, desirable to protect the chip by a fuse means in series with the device or component. It is also desirable to utilize a minimum area device, i.e., a submicron width fuse that lies in a planar surface with the protected part and that can interrupt at milliamp levels.

Metal fuses in this submicron width range cannot provide adequate protection for noise-suppression capacitors since they require currents of over 100 milliamps to interrupt the circuit.

Prior art in this field includes U.S. Pat. No. 5,019,532 issued to Kaya on May 28, 1991, which discloses a small fuse for use in a programmable read-only memory (PROM). The actual small fuse consists of a dielectric consisting of a composite layer of a thin nitride deposited over a thin oxide layer.

U.S. Pat. No. 4,647,340 issued to Szluk et al. on Mar. 3, 1987 also discloses a fuse formed of a selectively thinned oxide which degenerates to a resistance on application of the high voltage $V_{pp}$ when programming the chip.

U.S. Pat. No. 5,059,555 issued to Iranmanesh et al. on Oct. 22, 1991 discloses another vertical configuration fuse used in programming PROMs and programmable logic arrays (PLA). The vertical device is fabricated in the same structure as a polysilicon transistor. After programming, the fuse resistance is less than 150 ohms.

U.S. Pat. No. 4,598,462 issued to Chandrasekhar on Jul. 8, 1986 discloses a method and device for making a semiconductor where some of the elements have fuses formed adjacent and above the protected elements. The fuse element is a layer of silicon nitride covered by polysilicon and then covered by a platinum layer, forming a platinum silicide fuse after heating to 650° C. U.S. Pat. No. 4,518,981 issued to Schlupp on May 21, 1985 discloses a combined Schottky diode and fuse for programming a PROM. The fuse is activated by a high voltage and is constructed from a platinum silicide.

SUMMARY OF THE INVENTION

It is the purpose of this invention to provide a minimum volume, low-current fuse that is planar with and protects electrical devices and has a consistently reproducible current-interruption characteristic. The polysilicon fuse of the present invention provides these advantages. The fuse is actually of multi-layer construction consisting of a bottom insulating layer of silicon oxide $SiO_2$ about 3300 Å thick, an intermediate layer of tungsten silicide $Wsi_x$ about 1200 Å thick, and a top layer of polysilicon about 1850 Å thick.

The resulting fuse element in a 0.6 μm width typically interrupts at 24 milliamps (ma) and in a 1.5 μm width interrupts at 38 ma. In a similar width (0.8 μm), a metal fuse typically interrupts at between 150 and 250 ma. This will not protect a faulted capacitor circuit which typically draws current between 20–40 ma.

Other objects, advantages, and capabilities of the present invention will become more apparent as the description proceeds.

BRIEF DESCRIPTION OF THE DRAWINGS

The invention may be better understood and further advantages and uses thereof may become more readily apparent when considered in view of the following detailed description of the exemplary embodiments, taken with the accompanied drawings, in which.

DETAILED DESCRIPTION OF THE PREFERRED EMBODIMENTS

Figure 1:
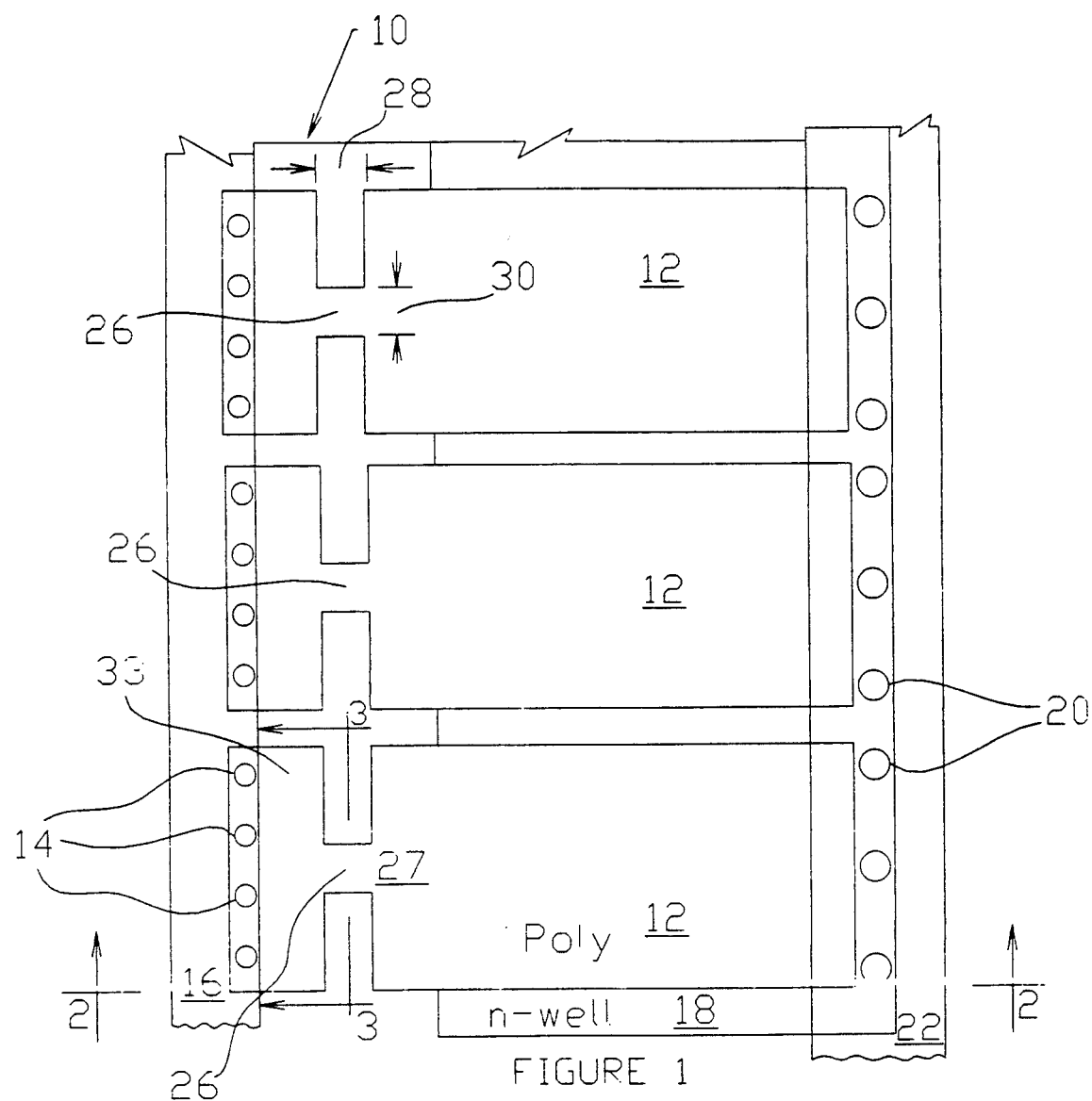
FIG. 1 is a plan view of a plurality of small capacitors and an attached polysilicon fuse.
Figure 2:
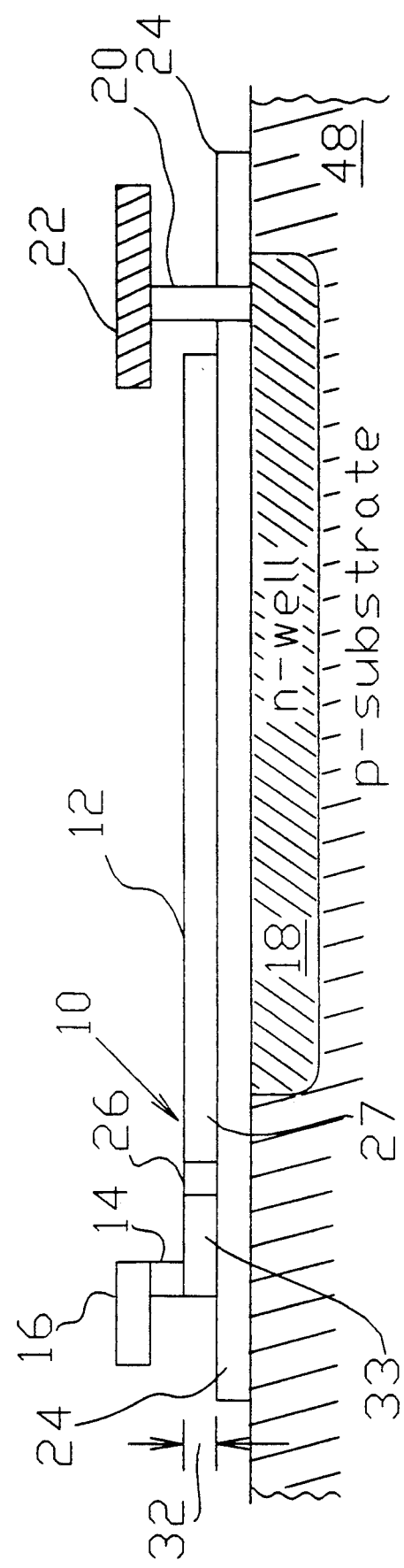
FIG. 2 is a cross-section taken through lines 2—2 of FIG. 1.

The polysilicon fuses 10 are illustrated in FIGS. 1 and 2 and are attached to capacitor top plates 12 on one end and connected by contacts 14 to metal conductor 16, to which voltage $V_{CCP}$ is applied, typically about 7.5 to 8 volts. A capacitor bottom plate 18 also connects by contacts 20 to metal conductor 22. A dielectric 24 separates the two plates 12 and 18. Conductor 22 in this application would be at potential $V_{SS}$, typically at ground. The actual fuse element 26 is a short-necked down section having a first fuse conducting means 27 connecting to the capacitor top plate 12 and having dimensions of about 2.5 μm in length (as at 28 in FIG. 1), 0.6 μm width (as at 30, and 0.63 μm height (as at 32 in FIG. 2). A second fuse conducting means 33 provides electrical connection via contacts 14 to the conductor $V_{CCP}$ 16. The resistance for this fuse element 26 would be about 90 ohms. A fuse element the same length and thickness but 1.5 μm width would have about 50 ohms resistance. In this application, the chip is protected from capacitor dielectric failure and the resulting excess current by the series fuse elements 26 which would interrupt current flow at a precise selected current.

Referring to FIG. 2, it can be seen that fuse 10 is planar with the protected capacitor plate 12 and, as described below, is fabricated from the same materials and construction, thereby simplifying chip fabrication.

Figure 3:
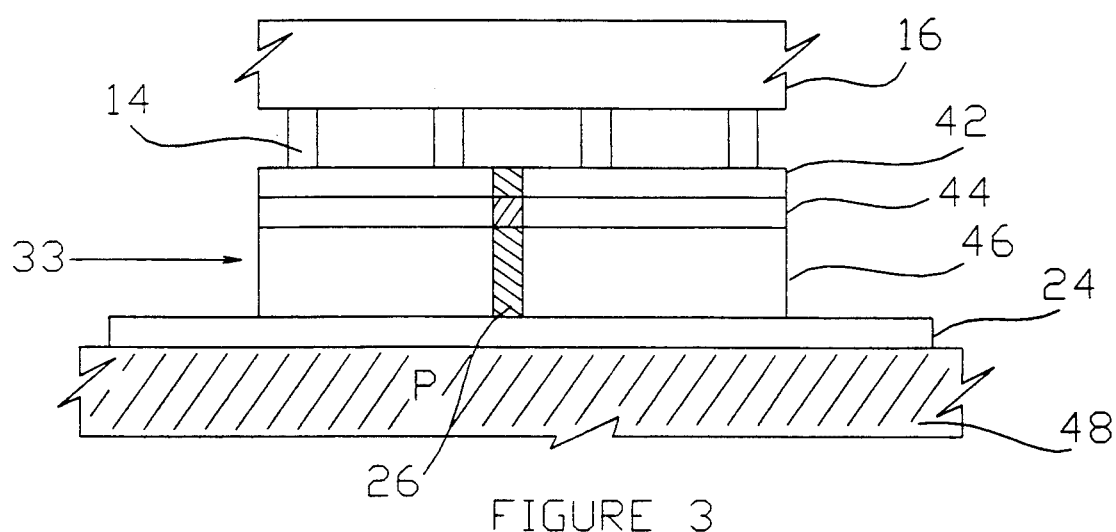
FIG. 3 is an enlarged cross-section taken through lines 3—3 of FIG. 1.

The actual construction of the fuse element 26 and capacitor top plate 12 can be seen on FIG. 3, cross-section view. From the top down, the insulating layer (not shown) covers aluminum ($V_{CCP}$) conductor 16 which has contacts 14 connecting to a top fuse layer of polysilicon 42 having a thickness of about 1850 Å. The polysilicon 42 is bonded to a tungsten silicide ($WSi_x$) layer 44 about 1200 Å thick. An insulating layer of silicon oxide ($SiO_2$) 46 lies below the $WSi_x$ of about 3300 Å thickness. The capacitor dielectric 24 lies between the fuse element 26 and P-doped substrate 48.

Figure 4:
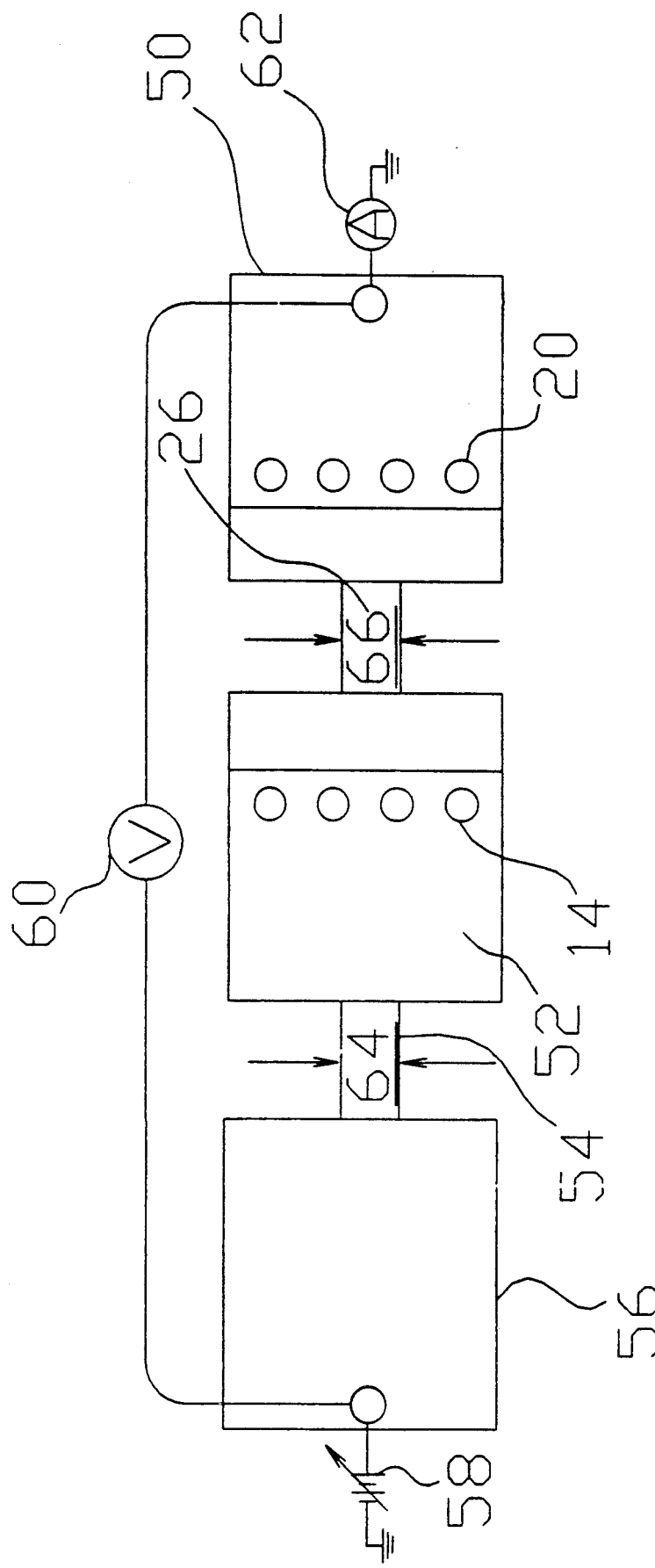
FIG. 4 is a schematic drawing of a fuse test setup.

In order to determine the current interruption characteristics of the poly fuse, a fuse test setup of FIG. 4 was assembled on a 4 meg DRAM chip. The poly fuse element 26 is shown connected by contacts 20 to metal conductor 50 on one side and to a second aluminum conductor 52 on the other. In this test setup, the second aluminum conductor 52 is also formed to make a necked-down-section, metal-fuse element 54. A third aluminum conductor 56 connects to variable voltage source 58 and has a connection to voltmeter 60, which measures the voltage across the first and third metal conductors when current flows through the two fuses 54 and 26 and is measured by ammeter 62. In this setup, the characteristics of both the metal fuse element 54 and poly fuse element 26 can be determined. The width 64 of metal fuse in this test was 0.8 μm (the minimum width attainable), and two sets of poly fuse widths at 66 were tested, i.e., 0.6 μm and 1.5 μm. The results of the test are listed in the table below.

TABLE 1

| Die No. | 0.6 μm mAmps | 1.5 μm mAmps |
| --- | --- | --- |
| 1 | 22.28 | 37.26 |
| 2 | 24.14 | 38.65 |
| 3 | 22.78 | 38.31 |
| 4 | 24.84 | 39.40 |
| 5 | — | 37.51 |
| x | 23.51 | 38.22 |
| σ | 1.18 | 0.8 |

The data indicates consistently close results for each width of fuse element, i.e., small standard deviation σ. During this test, the metal fuse never did interrupt and it was later determined by a different test setup that the current necessary to interrupt this size (width) of metal fuse that occurring in this application where a shorted capacitor only draws 20-40 ma.

In this test, the width 64 of metal fuse element 54 was about 0.8 μm and the layers of the fuse were (from top down) titanium 200 Å, aluminum 10,000 Å, and titanium nitride 350 Å, giving a total thickness of about 10,550 Å or 1.05 μm. The metal fuses also had a much greater variation or deviation than the poly fuse elements, i.e., 250–350 ma.

It can be mathematically shown that all parameters, except metal fuse element width remaining equal, i.e., length, thickness, resistivity of the metal, the width necessary to interrupt a 25 ma current would be approximately 0.01 μm, a width currently not within the state of the art.

Figure 5:
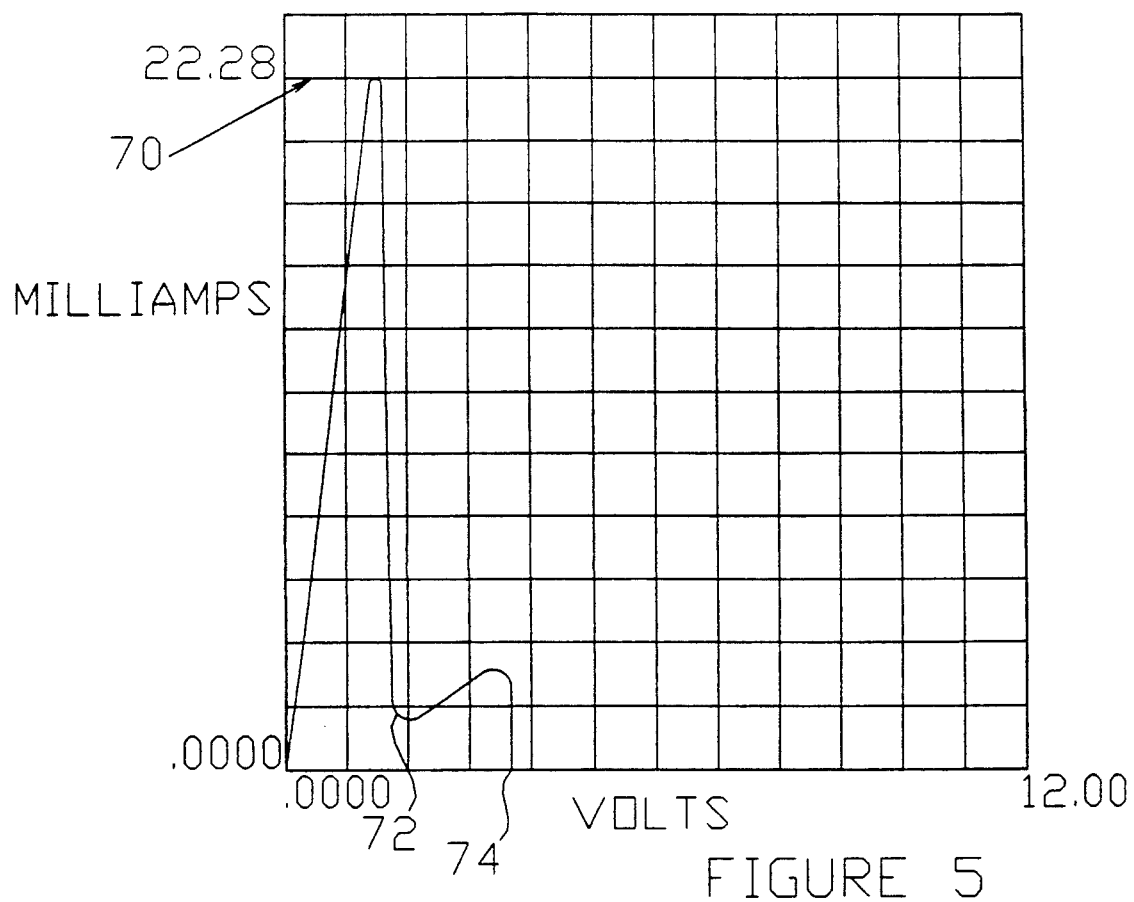
FIG. 5 is a graph of fuse current versus fuse voltage.

The current as a function of voltage in poly Die No. 1 (0.6 μm) is typically shown in FIG. 5. The current peak is at 70 and is about 22.28 ma. The graphs of the other four 0.6 μm width poly fuse elements are very similar and have not been included. The plots for the five 1.5 μm width poly fuse elements have the same basic shape having only higher peaks, i.e., about 38 ma. An interesting phenomenon can be noted at 72 where the current has a shoulder, which is equivalent to a current limit function at about 2 ma, until the voltage increases to about 4 volts and the current then drops to zero as at 74. This same current limit characteristic was present in all test traces for both the 0.6 μm and the 1.6 μm width fuse.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. In an integrated circuit semiconductor chip, a low-current, interrupting, polysilicon fuse for protecting a peripheral noise-filtering capacitor comprising:
   a. a first electrical conducting means connecting to the capacitor;
   b. a reduced cross-section fuse element of about 2.5 μm length, 1.5 μm width, 0.63 μm height, and 90 ohms resistance, planar with the capacitor connecting to the first conducting means; and
   c. a second fuse conducting means connecting to the fuse element and connecting by a plurality of contacts to a power supply conductor wherein the fuse element, fuse conducting means, and electrical device consist of a top layer of polysilicon, a middle layer of tungsten silicide, and a bottom layer of silicon oxide, and wherein a low but destructive current of about 24 milliamps within the capacitor causes current interruption by the fuse element, thereby preventing chip failure.

2. In an integrated circuit semiconductor chip, a low-current, interrupting, polysilicon fuse for protecting a chip peripheral, noise-filtering capacitor comprising:
   a. a first electrical conducting means connecting to the capacitor;
   b. a reduced cross-section fuse element of about 2.5 μm length, 1.5 μm width, 0.63 μm height, and 90 ohms resistance, planar with the capacitor connecting to the first conducting means; and
   c. a second fuse conducting means connecting to the fuse element and connecting by a plurality of contacts to a power supply conductor, wherein the fuse element, fuse conducting means, and capacitor consist of a top layer of polysilicon about 1800 Å in height, a middle layer of tungsten silicide about 1200 Å in height, and a bottom layer of silicon oxide about 3300 in Å height and, wherein a low but destructive current of about 24 milliamps within the capacitor causes current interruption by the fuse element, thereby preventing chip failure.

3. In an integrated circuit semiconductor chip, a low-current, interrupting, polysilicon fuse for protecting a peripheral noise-filtering capacitor comprising:
   a. a first electrical conducting means connecting to the capacitor;
   b. a reduced cross-section fuse element of about 2.5 μm length, 0.6 μm width, 0.63 μm height, and 50 ohms resistance, planar with the capacitor connecting to the first conducting means; and
   c. a second fuse conducting means connecting to the fuse element and connecting by a plurality of contacts to a power supply conductor wherein the fuse element, fuse conducting means, and electrical device consist of a top layer of polysilicon, a middle layer of tungsten silicide, and a bottom layer of silicon oxide, and wherein a low but destructive current of about 38 milliamps within the capacitor causes current interruption by the fuse element, thereby preventing chip failure.

4. In an integrated circuit semiconductor chip, a low-current, interrupting, polysilicon fuse for protecting a chip peripheral, noise-filtering capacitor comprising:
   a. a first electrical conducting means connecting to the capacitor;
   b. a reduced cross-section fuse element of about 2.5 μm length, 0.6 μm width, 0.63 μm height, and 50 ohms resistance, planar with the capacitor connecting to the first conducting means; and c. a second fuse conducting means connecting to the fuse element and connecting by a plurality of contacts to a power supply conductor wherein the fuse element, fuse conducting means, and capacitor consist of a top layer of polysilicon about 1800 Å in height, a middle layer of tungsten silicide about 1200 Å in height, and a bottom layer of silicon oxide about 3300 Å in height, and wherein a low but destructive current of about 38 milliamps within the capacitor causes current interruption by the fuse element, thereby preventing chip failure.

* * * * *